(12) United States Patent
Verma et al.

(10) Patent No.: US 12,372,572 B2
(45) Date of Patent: Jul. 29, 2025

(54) TRANSMIT MODULATION TESTING

(71) Applicant: Silicon Laboratories Inc., Austin, TX (US)

(72) Inventors: Anant Verma, Austin, TX (US); Rangakrishnan Srinivasan, Austin, TX (US); Zhongda Wang, San Jose, CA (US)

(73) Assignee: Silicon Laboratories Inc., Austin, TX (US)

( * ) Notice: Subject to any disclaimer, the term of this patent is extended or adjusted under 35 U.S.C. 154(b) by 44 days.

(21) Appl. No.: 18/174,003

(22) Filed: Feb. 24, 2023

(65) Prior Publication Data

US 2024/0110972 A1    Apr. 4, 2024

Related U.S. Application Data

(60) Provisional application No. 63/412,063, filed on Sep. 30, 2022.

(51) Int. Cl.
*G01R 31/28* (2006.01)
*H04B 17/14* (2015.01)
*H04L 27/12* (2006.01)

(52) U.S. Cl.
CPC ......... *G01R 31/2824* (2013.01); *H04B 17/14* (2015.01); *H04L 27/12* (2013.01)

(58) Field of Classification Search
None
See application file for complete search history.

(56) References Cited

U.S. PATENT DOCUMENTS

| | | | |
|---|---|---|---|
| 11,973,509 B2 * | 4/2024 | Srinivasan | H03L 7/10 |
| 2017/0279452 A1 * | 9/2017 | Hayashi | H03L 1/04 |
| 2022/0166381 A1 * | 5/2022 | Joshi | H03B 5/1206 |

* cited by examiner

*Primary Examiner* — Jermele M Hollington
(74) *Attorney, Agent, or Firm* — Zagorin Cave LLP

(57) ABSTRACT

Modulation testing separately enables slices of an analog varactor array of an LC oscillator. For each enabled slice, a reference voltage supplying a resistor ladder is set to a plurality of different reference voltage values. Resistor ladder voltages generated for the different reference voltage values are supplied to the enabled slice and a control voltage coupled to the enabled slice is swept for each of the reference voltage values. Respective frequencies of an oscillator signal coupled to an output of the LC oscillator are measured for each enabled slice for each combination of the reference voltage values and the control voltage values. The linearity of LC oscillator gain is determined for each of the reference voltage values for each slice based on the respective frequencies and the control voltage values. Passing/failing the modulation testing is based on the linearity of the LC oscillator gain.

17 Claims, 14 Drawing Sheets

| 2 Mbps |||||||
|---|---|---|---|---|---|---|
| | Actual Coefficients ||| Ideal Coefficients |||
| BW(MHz) | #Taps | df1 | df2 | df2/df1 | #Taps | df1 | df2 | df2/df1 |
| 1.0 | 46 | 1.25 | 0.71 | 0.57 | 90 | 1.02 | 0.89 | 0.87 |
| 1.2 | 46 | 1.21 | 0.78 | 0.64 | 87 | 1.03 | 0.86 | 0.83 |
| 1.5 | 46 | 1.14 | 0.83 | 0.73 | 85 | 1.00 | 0.87 | 0.87 |
| 2.0 | 46 | 1.08 | 0.94 | 0.87 | 82 | 0.99 | 0.86 | 0.87 |
| 2.5 | 46 | 1.06 | 0.97 | 0.92 | 78 | 1.00 | 0.87 | 0.87 |
| 3.0 | 46 | 1.02 | 0.95 | 0.93 | 74 | 0.98 | 0.85 | 0.87 |

TRANSMIT MODULATION TESTING

CROSS REFERENCE TO RELATED APPLICATION(S)

This application claims benefit of provisional application 63/412,063 entitled "A LOW-COST, FAST AND ACCURATE TEST METHOD FOR BLUETOOTH TRANSMIT MODULATION" naming Anant Verma et al., as inventors, which application was filed Sep. 30, 2022, and which application is incorporated herein by reference.

BACKGROUND

Field of the Invention

The technical field relates to wireless transmitters and more particularly to testing transmitters used in wireless internet-of-things (IoT) devices.

Description of the Related Art

Integrated circuits (ICs) that operate as internet-of-things (IoT) devices can include a variety of wireless transceivers, including Bluetooth® (BT) and Bluetooth Low Energy (BLE) devices. In some cases, BLE devices may fail due to transmit modulation issues. Thus, some customers may request that BLE transmit modulation tests be performed during production to ensure quality of parts. Such testing may delay the shipment of BLE devices to customers due to the additional test time needed to perform such tests. In addition to shipment delays, currently available BLE transmit modulation tests require expensive test equipment, backend digital signal processing, and long test times.

To avoid these disadvantages, new test methods are needed to detect BLE transmit modulation failures without implementing traditional BLE transmit modulation tests in the production test environment.

SUMMARY OF EMBODIMENTS OF THE INVENTION

The present disclosure provides a low-cost, fast, and accurate test technique for detecting transmit modulation failures due to non-linearities in the oscillator. The test approach provided in the present disclosure can be implemented in firmware (e.g., an on-chip test circuit), and thus, obviate the need to perform traditional transmit modulation tests in the production test environment.

In one embodiment a method for modulation testing includes setting a reference voltage supplied to a resistor ladder to a plurality of reference voltage values and supplying a plurality of resistor ladder voltages to a first slice of an analog capacitor array of an LC oscillator for each of the reference voltage values. The method further includes setting a control voltage for the first slice to a plurality of control voltage values for each of the reference voltage values. Respective frequencies of an output signal coupled to the LC oscillator are measured and stored for each combination of the reference voltage values and the control voltage values used with the first slice. With the first slice disabled, the reference voltage supplied to the resistor ladder is set to the plurality of reference voltage values and the plurality of resistor ladder voltages are supplied to a second slice of the analog capacitor array for each of the reference voltage values. The control voltage for the second slice is set to the plurality of control voltage settings for each of the reference voltage values. Respective frequencies of the output signal for each combination of the control voltage values and the reference voltage values used with the second slice are measured and stored as second frequency results.

In another embodiment, an apparatus includes an LC oscillator having a varactor array with a plurality of slices. An oscillator signal is coupled to an output of the LC oscillator. A resistor ladder provides a plurality of resistor ladder voltages that are selectively coupled to the plurality of slices according to coarse control signals. A reference voltage is coupled to the resistor ladder and the resistor ladder voltages are determined in part based on the reference voltage. A control voltage is coupled to each of the plurality of slices. Control logic sets the reference voltage to a plurality of reference voltage values for each slice of the plurality of slices while other ones of the slices are disabled and sets the control voltage to a plurality of control voltage values for each of the reference voltage values. A frequency measuring circuit is coupled to measure a frequency of the oscillator signal for each combination of the reference voltage values and the control voltage values for each slice and to supply measured frequency values. A storage circuit stores the measured frequency values.

In another embodiment a method for modulation testing includes separately enabling a plurality of slices of an analog varactor array of a voltage-controlled oscillator (VCO). For each enabled slice, a reference voltage coupled to a resistor ladder is set to a plurality of reference voltage values. Resistor ladder voltages generated for the plurality of reference voltage values are supplied to the enabled slice and a control voltage coupled to the enabled slice is set to a plurality of control voltage values for each of the reference voltage values. Respective frequencies of an oscillator signal coupled to an output of the VCO are measured for each enabled slice for each combination of the reference voltage values and the control voltage values. The linearity of VCO gain is determined for each of the reference voltage values for each slice based on the respective frequencies and the control voltage values.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

The present disclosure provides an improved test approach for detecting transmit modulation failures. More specifically, the present disclosure describes a low-cost, fast, accurate and robust test approach for detecting transmit modulation failures without employing the actual traditional modulation test itself. In some embodiments, the test approach described herein may be implemented in firmware provided, e.g., within an on-chip test circuit that includes a microcontroller.

Figure 1:
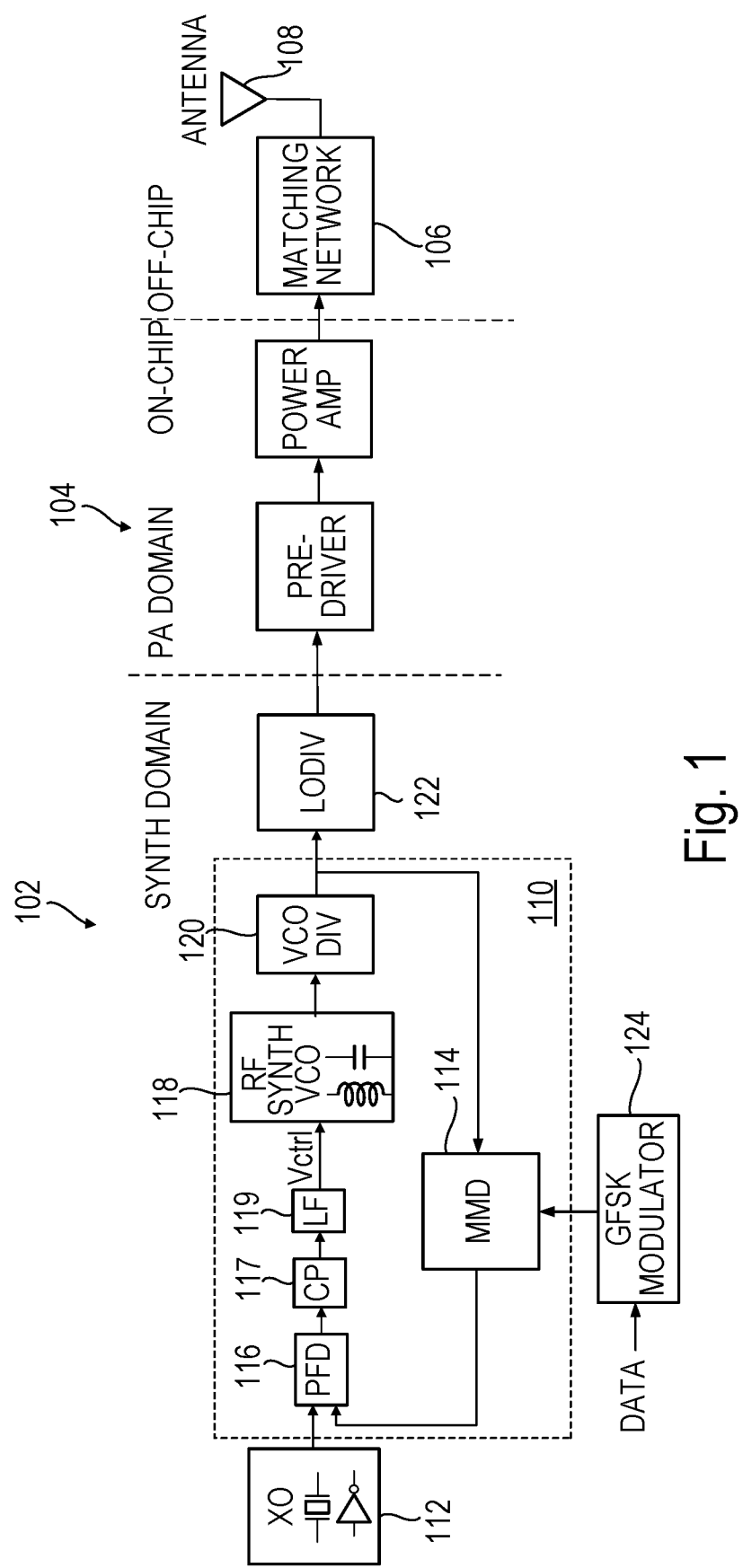
FIG. 1 is a block diagram illustrating an example architecture of a Bluetooth Low Energy (BLE) transmitter.

FIG. 1 illustrates an example architecture for a Bluetooth transmitter. As shown in FIG. 1, the illustrated embodiment of a Bluetooth transmitter includes a radio frequency (RF) synthesizer domain 102 containing an RF synthesizer and a power amplifier (PA) domain 104. A matching network 106 and an antenna 108 are off-chip as is the crystal of the crystal oscillator. The RF synthesizer includes a phase locked loop (PLL) 110. A crystal oscillator (XO) 112 supplies a reference clock signal to the phase frequency detector (PFD) 116. The PFD 116 supplies a phase difference between the feedback signal from the multi-modulus divider 114 and the reference clock signal from the XO 112 to the charge pump (CP) 117. The CP 117 supplies a loop filter (LF) 119. The LF 119 supplies a voltage control signal Vctrl to control the frequency of the output signal supplied by signal-controlled oscillator 118. In the illustrated embodiment, the signal-controlled oscillator is a voltage-controlled oscillator (VCO) and in other embodiments the signal controlling the oscillator is a digital signal or another analog signal, e.g., current. In an embodiment the PLL includes divider 120 that supplies a divided oscillator feedback signal to the MMD 114. In the illustrated embodiment, output divider (LO DIV) 122 supplies a local oscillator (LO) signal to the PA domain. Other embodiments omit one or both dividers 120 and 122. In the example architecture shown in FIG. 1, the transmitter utilizes GFSK modulation. As shown in FIG. 1, a GFSK modulator 124 is coupled to the MMD 114 to control the feedback divider and thus the frequency of the PLL output signal. The GFSK modulator 124 provides direct PLL-based modulation. In an embodiment the modulation port DATA supplies the input to the modulator 124 based on data supplied from off chip.

Figure 2:
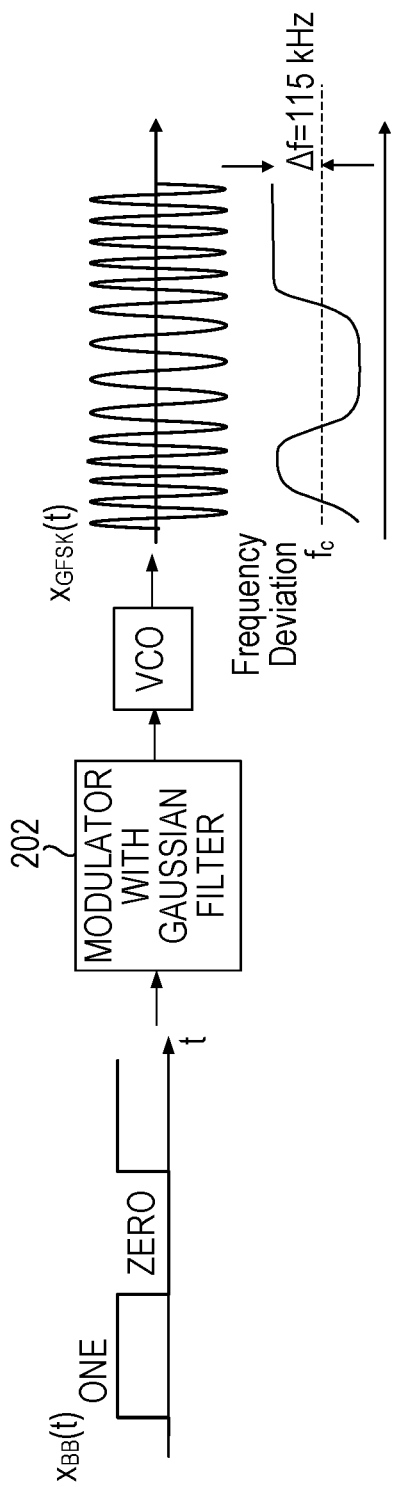
FIG. 2 is a block diagram illustrating an example Gaussian frequency-shift keying (GFSK) modulation scheme.

FIG. 2 illustrates the GFSK modulation scheme. The baseband value of a one or a zero is supplied to the GFSK modulator 202, which contains a Gaussian filter. The GFSK modulator controls the PLL through the feedback divider such that the output signal generated by the PLL (after any dividers) has a frequency higher than the carrier frequency (fc) by, e.g., at least 115 kHz (for Bluetooth Classic) to represent a one and has a frequency lower than fc by at least 115 kHz to represent a zero. Other applications will have different frequency differences to represent ones and zeros. If there are modulation errors by the transmitter, the transmissions will fail to represent the data accurately. While examples given herein are associated with GFSK for BLE, modulation testing described herein can be applied to other PLL-based modulation schemes for constant envelope transmitters. Minimum shift keying (MSK) is another application for which the modulation testing described herein could be applied.

$$BW_{-3dB} \approx \frac{R_{LF} \times I_{CP} \times K_{VCO}}{2\pi N}$$

Figure 3:
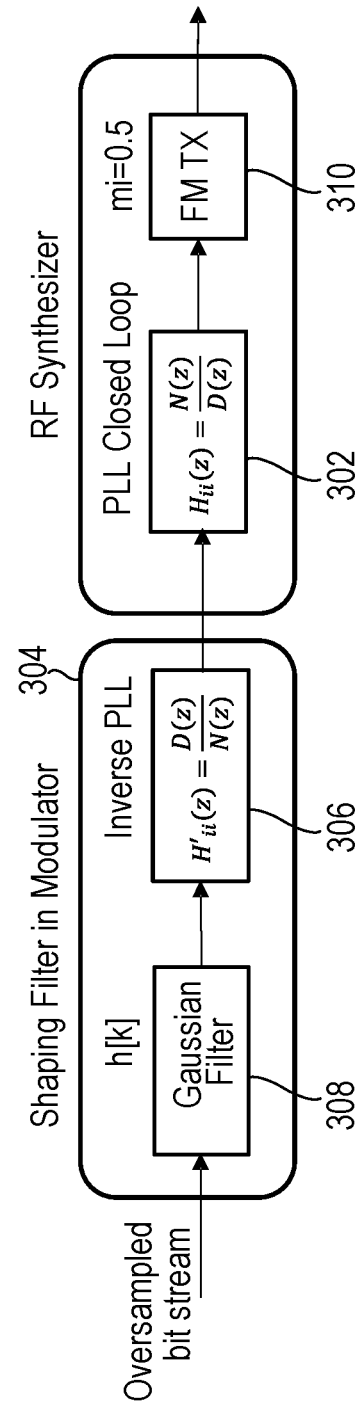
FIG. 3 is a block diagram illustrating use of a shaping filter in the modulator to compensate for the effects of the PLL.

For the modulation port, DATA, the PLL can act as a low-pass filter with a closed loop bandwidth (BW) according to the following equation:

$$BW_{-3dB} \approx \frac{R_{LF} \times I_{CP} \times K_{VCO}}{2\pi N},$$

$$BW_{-3dB} \approx \frac{R_{LF} \times I_{CP} \times K_{VCO}}{2\pi N}$$

where $R_{LF}$ is the resistance of the loop filter, $I_{CP}$ is the charge pump current, Kvco is VCO gain, and N is the feedback divider value. Higher data rates through the low-pass filter can lead to linear distortion and intersymbol interference (ISI). FIG. 3 illustrates the closed loop PLL transfer function 302 in the RF synthesizer. A shaping filter 304 in the GFSK modulator compensates for the linear distortion by providing the inverse PLL transfer function 306 following the Gaussian filter 308. Note that "mi" is the modulation index (between 0.45 and 0.55 for BLE). The PLL supplies the frequency modulated transmitter 310.

Direct modulation of the PLL 110 (see FIG. 1) in the RF synthesizer relies on accurate bandwidth (BW) control to meet BLE transmit modulation requirements. The VCO gain (Kvco) is a key parameter for PLL bandwidth control. For example, the VCO generates a change in frequency ($f_{VCO}$) due to a change in the control voltage (Vctrl), where $f_{VCO} = K_{VCO} \times V_{ctrl}$. When the PLL is locked, the VCO preferably demonstrates a linear gain ($K_{VCO}$) over Vctrl. However, due to manufacturing defects and oxide definition (OD) density induced $K_{VCO}$ defects, the $K_{VCO}$ could be lower and outside of the preferred range. That would lead to a reduction in PLL bandwidth resulting in BLE transmit modulation failure. Note that the VCO gain may also be referred to herein as KV or kv.

Figures 4, 5:
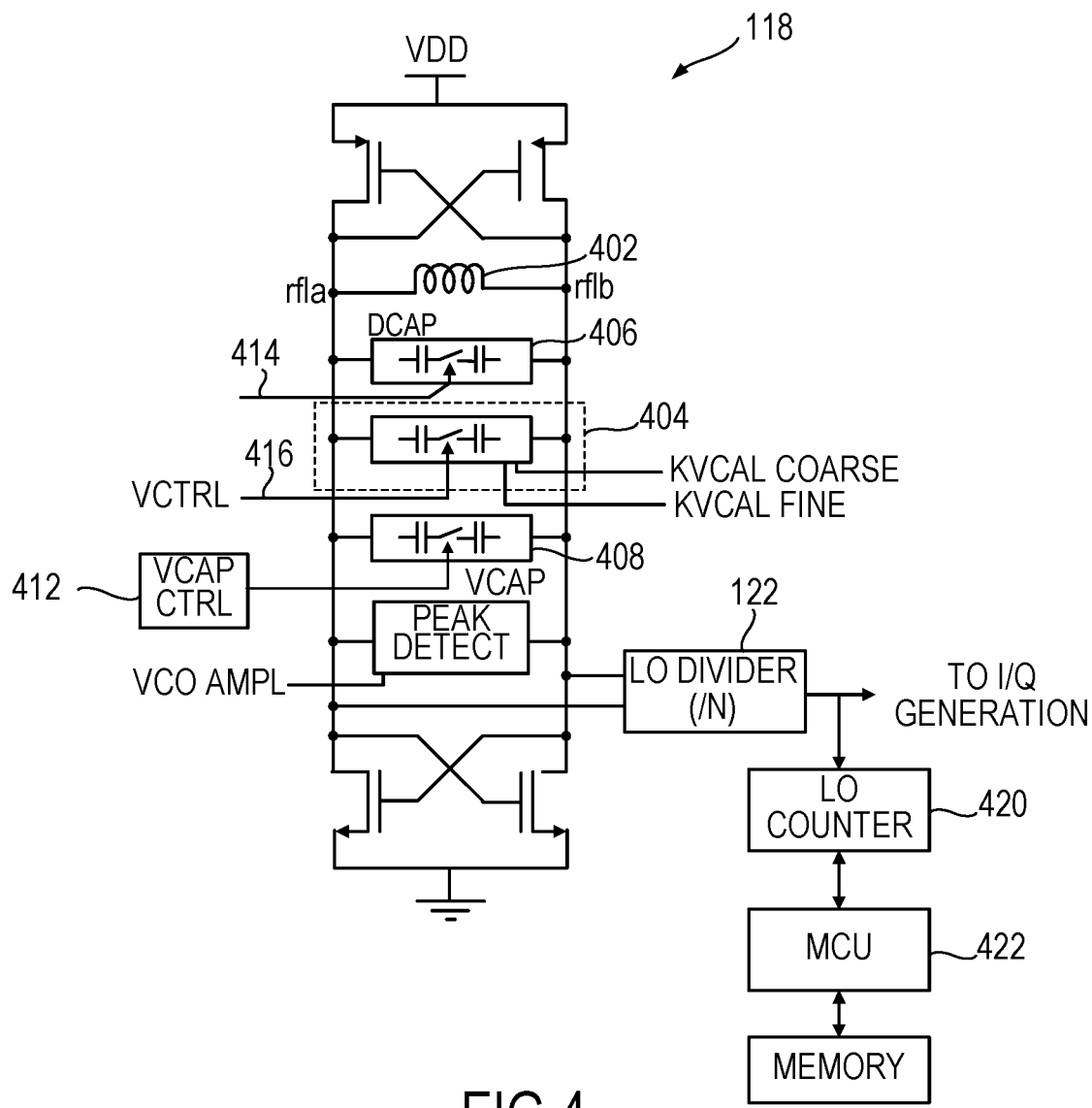
FIG. 4 is a simplified circuit diagram illustrating one embodiment of a voltage-controlled oscillator (VCO) that includes an analog varactor capacitor array.
FIG. 5 is a table that shows modeling of 2 Mbps BLE transmit modulation characteristics.

FIG. 4 is a block diagram of an embodiment of VCO 118. The VCO 118 is an LC oscillator and includes inductor 402 and an analog varactor capacitor (ACAP) array 404, which is responsible for the gain $K_{VCO}$. The analog varactor capacitor array 404 is responsible for achieving the linear relationship of $K_{VCO}$ over Vctrl. In one or more embodiments, the analog capacitor array 404 utilizes $K_{VCO}$ tuning to tune the gain through the signals KVCAL COARSE and KVCAL FINE as explained further herein.

The illustrated VCO includes additional capacitor arrays 406 and 408. The capacitor circuit (DCAP) 406 is a digital capacitor array controlled by the calibration signal FCAL 414 and is used to provide a setting for frequency locking by the synthesizer to the desired frequency. The third capacitor circuit 408 (VCAP) is a variable capacitor circuit controlled by the VCAP control block 412. The VCAP capacitor circuit 408 provides both temperature compensation (TCOMP) and local oscillator compensation (LOCOMP) for frequency changes. The nodes rfla and rflb denote the RF voltages across the inductor terminals a and b and represents the output of the VCO.

The VCO gain (Kvco) directly impacts the closed loop bandwidth (BW) of the PLL, and thus, the BLE transmit modulation characteristics. The table in FIG. 5 illustrates a modeling of 2 Mbps BLE transmit modulation characteristics with pre-emphasis for the BLE transmitter architecture shown in FIG. 1. The example BLE transmitter architecture can tolerate a PLL bandwidth variation of 15%, while meeting BLE modulation specification requirements of 0.9<df1<1.1; df2>0.74; and df2/df1>0.8). The parameters df1 and df2 measure the deviation from nominal for two data patterns as specified in the BLE standard. The bolded entries in the df1, df2, and df2/df1 columns indicate parameters outside the specification. Note that the "Actual" column constrains the FIR length to 46 while the "Ideal" column does not. For the shaping filter shown in FIG. 3, a lower PLL bandwidth leads to a degraded df2 with an increase in df1. The loop bandwidth variation is in the vicinity of 20-30% lower than nominal on some devices with modulation failures.

Figure 6:
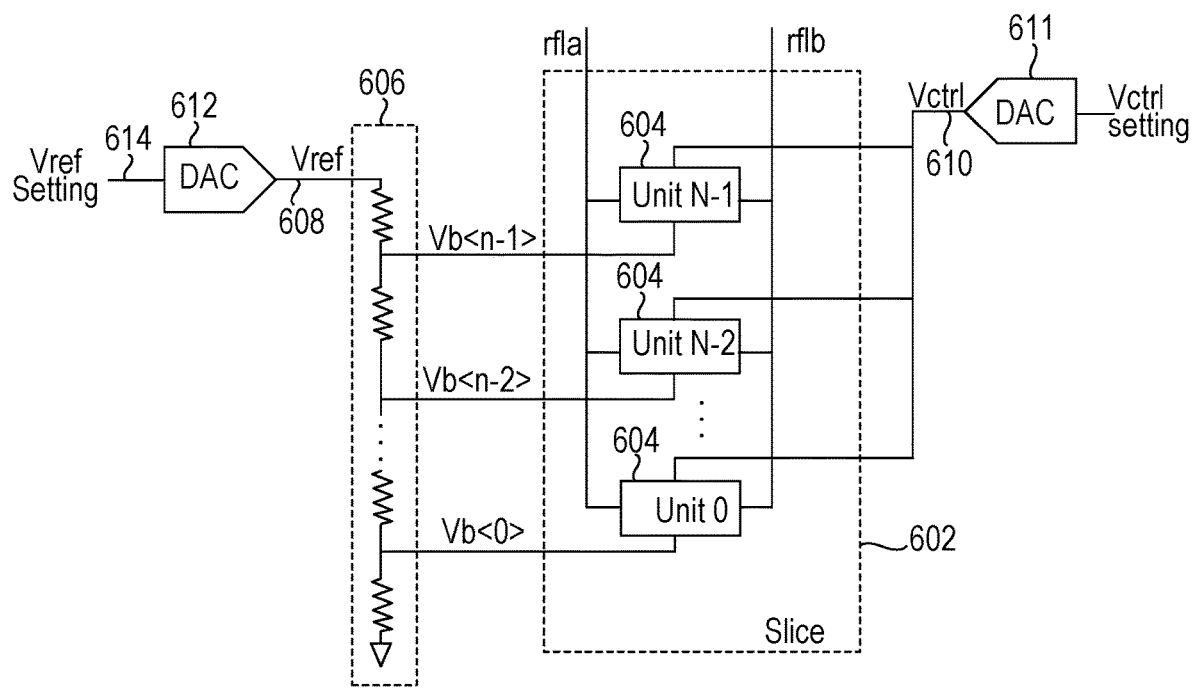
FIG. 6 illustrates an analog varactor slice and a resistor ladder generating voltages for the unit capacitors in the varactor slice.

FIG. 6 illustrates an analog varactor slice 602 of an analog varactor array. The slice 602 includes N unit capacitors 604. A resistor ladder 606 receives a reference voltage (Vref) 608 and supplies N voltage values (Vb) for use by each unit capacitor of the slice 602. In an embodiment, the resistor ladder increases by 25 mV for each output. The slice also receives a control voltage (Vctrl) 610 that is supplied to each unit capacitor 604. The control voltage 610 corresponds to VCTRL 416 shown in FIG. 4. The DAC 611 converts a digital signal (Vctrl setting) to the Vctrl voltage. During normal operation, Vref is fixed and Vctrl 610 is adjusted by changing the Vctrl setting to change the frequency of the VCO. As Vctrl goes higher, more unit capacitors turn on because Vctrl becomes greater than the Vb<x> being supplied to the particular unit capacitor. In an embodiment an additional capacitor turn on for each 25 mV increase in Vctrl.

Figure 7:
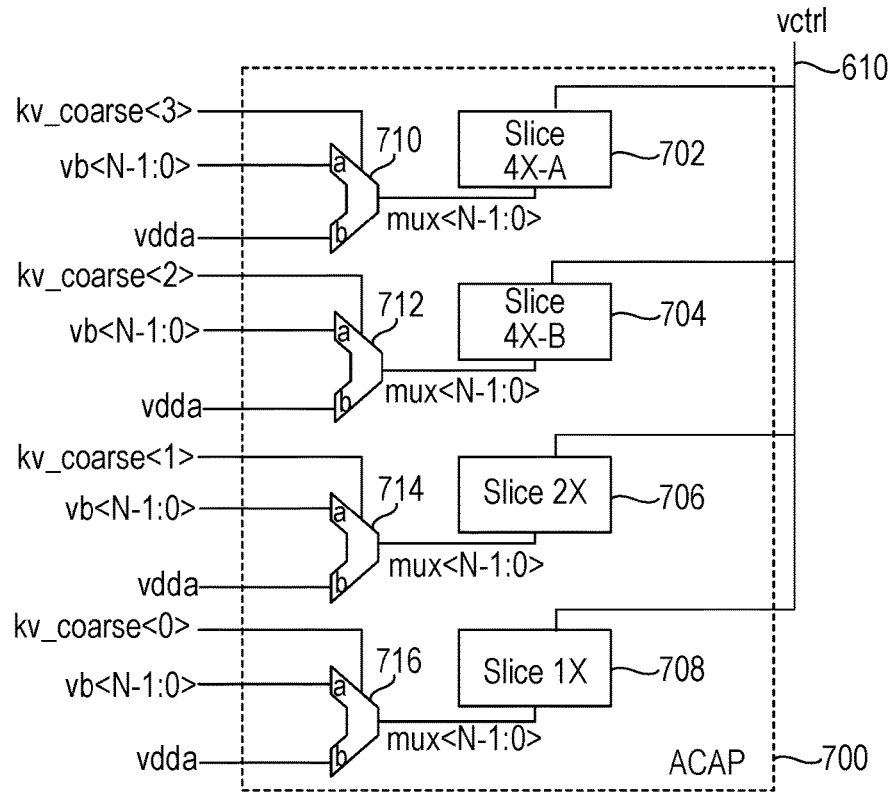
FIG. 7 illustrates an embodiment of an analog varactor capacitor array with multiple slices.

As shown in FIG. 7, an embodiment 700 of the analog varactor capacitor array 404 has multiple varactor slices 702, 704, 706, 708. In the embodiment shown in FIG. 7, the slices 702 and 704 are 4 fF/V slices, slice 706 is a 2 fF/V slice and slice 708 is a 1 fF/V slice. Slice 702 and 704 are identical slices and the varactor capacitor array is also referred to as a 4x-B, 4x-A, 2x, 1x array with 4x-B and 4x-A corresponding to varactor slices 702 and 704. Each of the varactor slices are tuned using coarse and fine Kvco calibration tuning shown in FIG. 4 as KVCAL COARSE and KVCAL FINE.

The coarse calibration tuning signals kv_coarse<n> shown in FIG. 7 are used to enable the individual slices. The kv_coarse<n> tuning signals shown in FIG. 7 correspond to KVCAL COARSE shown in FIG. 4. The signal kv_coarse<3> enables/disables slice 702 by causing multiplexer 710 to select either the resistor ladder voltages vb<N−1:0> or the voltage vdda for slice 702. The signal kv_coarse<2> enables/disables slice 704 by causing multiplexer 712 to select either the resistor ladder voltages vb<N−1:0> or the voltage vdda for slice 704. The signal kv_coarse<1> enables/disables slice 706 by causing multiplexer 714 to select either the resistor ladder voltages vb<N−1:0> or the voltage vdda for slice 706. The signal kv_coarse<0> enables/disables slice 708 by causing multiplexer 716 to select either the resistor ladder voltages vb<N−1:0> or the voltage vdda for slice 708. If the resistor ladder voltages are selected for a slice, then Vctrl determines the capacitance value of the slice, assuming the resistor ladder receives a fixed value of Vref. If vdda is selected, the voltage vdda is high enough to ensure that none of the capacitors in the slice turn on so the slice is disabled. In an embodiment, the microcontroller unit (MCU) 422 (see FIG. 4) controls the coarse calibration by writing storage locations supplying the coarse calibration bits. Note that depending on the layout of the slices, certain slices may suffer significantly more Kvco defects than others. For example, even though slices 4x-A and 4x-B are "exact" copies, process and a different surrounding environment for the slices can make one of the slices more susceptible to Kvco defects than its exact copy.

In addition to the coarse calibration provided by kv_coarse<3:0>, fine Kvco calibration is achieved by adjusting Vref, which is the voltage being supplied to the resistor ladder. Vref corresponds to KVCAL FINE shown in FIG. 4. FIG. 6 shows a digital to analog converter (DAC) 612 supplying Vref. The Vref control signal 614 supplies digital values that DAC 612 converts to the analog voltage Vref. Thus, the Vref control signal 614 can be adjusted to finely calibrate Kvco.

Figure 8:
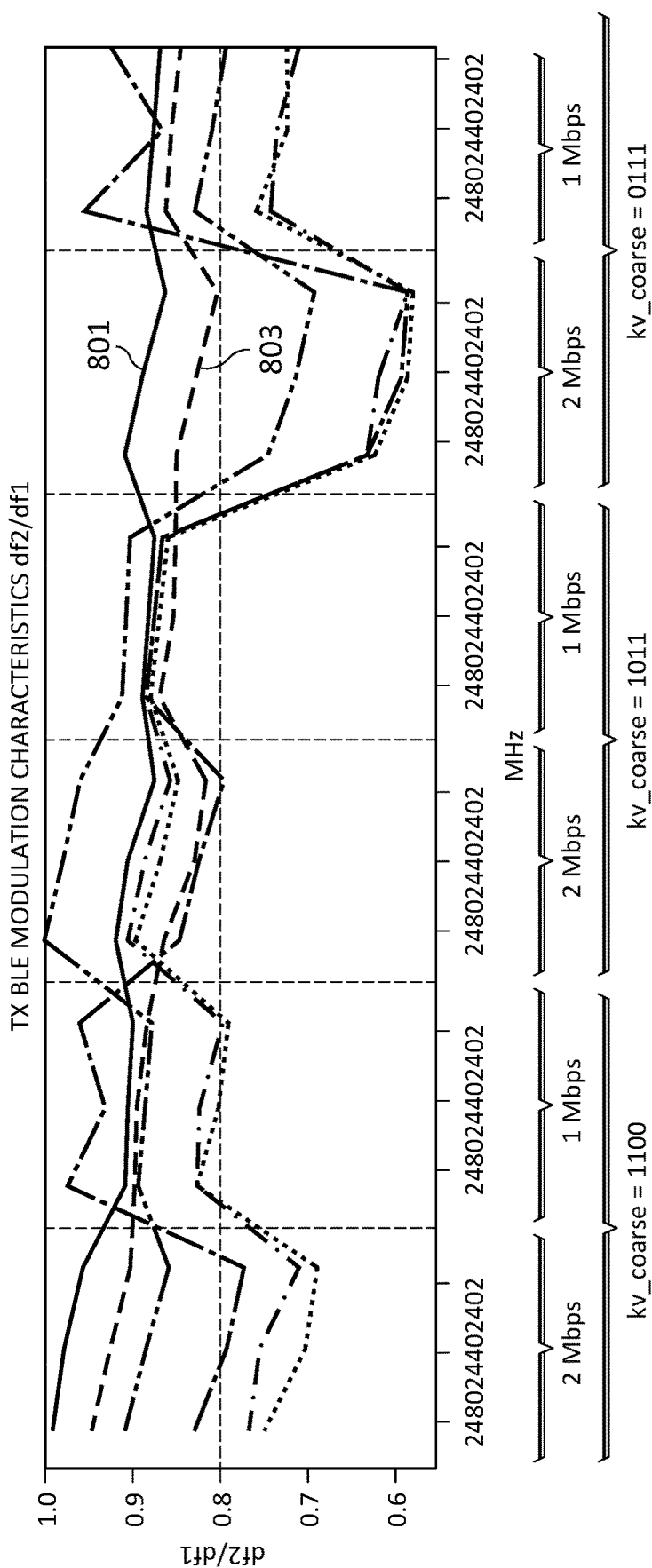
FIG. 8 illustrates BLE transmit modulation characteristics df2/df1 for different coarse setting of the analog varactor array for three BLE frequencies for two different BLE data rates (1 Mbps and 2 Mbps).

In some cases, the analog varactor array included within the VCO is the root cause of BLE transmit modulation failures. FIG. 8 illustrates BLE transmit modulation characteristics df2/df1 for different coarse settings of the analog varactor array for three BLE frequencies (2402, 2440, and 2480 MHz) for two different BLE bit rates (1 Mbps and 2 Mbps) for 6 parts. For the coarse setting with slice 4x-A and 4x-B enabled (kv_coarse=1100), failures can be seen (curves for which df2/df1<0.8). Where slices 4x-B and 2x and 1x are enabled (kv_coarse=1011) df2/df1>0.8, thus meeting specification requirements. Finally, for a coarse setting of kv_coarse=0111 (4x-A, 2x and 1x enabled), failures again occur. As 4x-A and 4x-B have the same 4 fF/V gain, the Kvco in both conditions are the same. It can be inferred that slice 4x-A is involved in both failures and thus is presumably the failing slice. Curve 801 represents a known good part and the remaining curves indicate failures (<0.8) or close to failure (curve 803).

Figure 9:
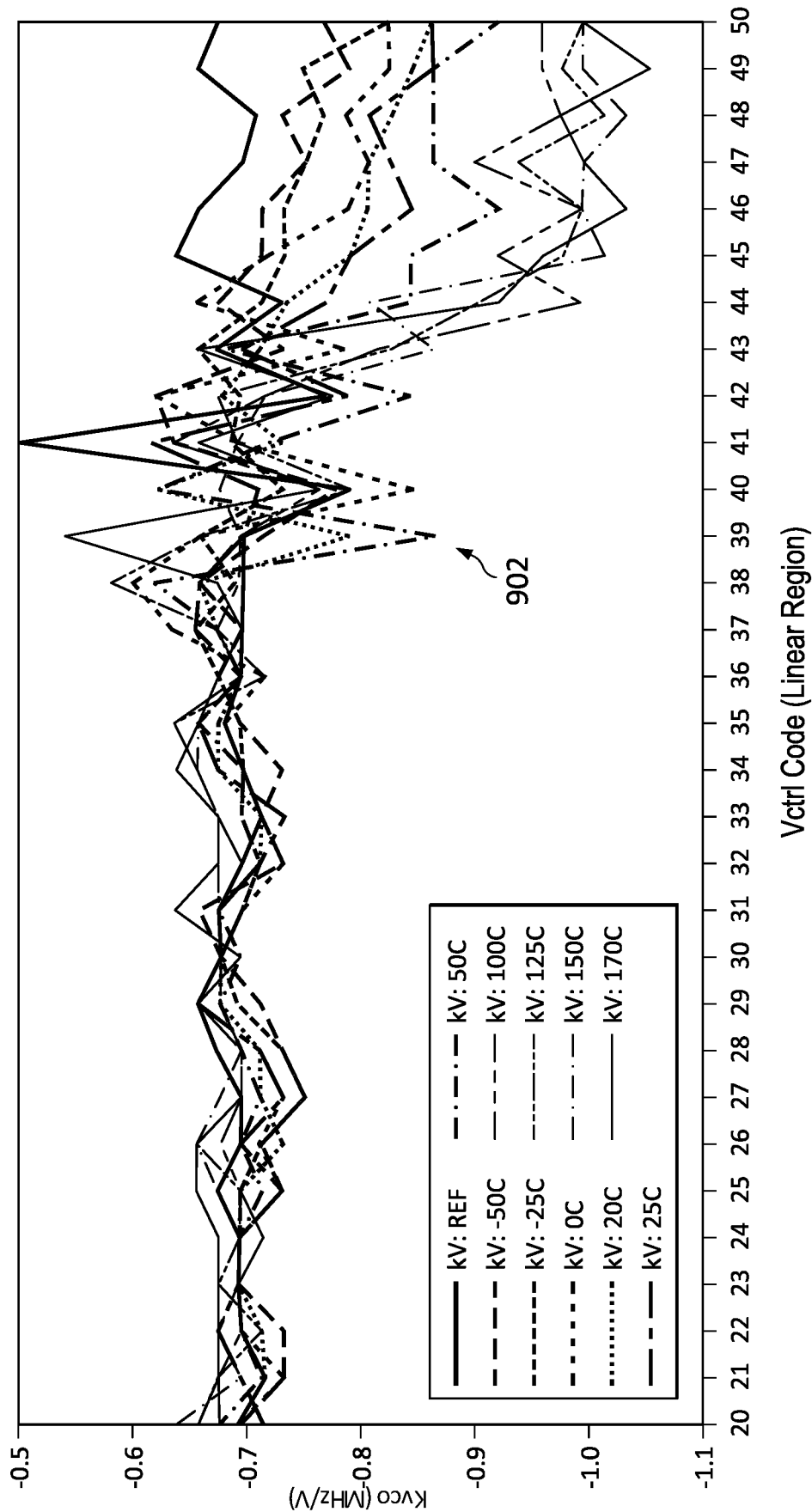
FIG. 9 illustrates the Kvco performance of a "bad" varactor slice at different temperatures.

The graph shown in FIG. 9 illustrates a Kvco curve of frequency (MHz) vs control voltage (Vctrl) control code in the linear region of interest where the value of the control code ranges between approximately 20 to 50. Each curve shows the Kvco curve at different temperatures. The Kvco curve shown in FIG. 9 represents a "bad" part, which shows a non-linearity in the linear region at 902. The non-linearity can sometimes be outside of the region being tested. In addition, the magnitude of the Kvco curve can also change. Thus, picking too few points on the curve to measure Kvco can also hide failures. Certain temperatures show more non-linearity of the Kvco curve than others. In addition, picking too few gain settings for gain measurement may hide nonlinearity between the particular settings. Thus, non-linearities may be hidden by the temperature selected or the gain settings chosen.

Accordingly, another approach evaluates each slice of the varactor array and each possible setting of each slice but only at a single temperature. The varactor array may be considered to be formed by multiple DACs that work together to generate the frequency. In an embodiment, the fine control setting Vref varies over 16 voltage settings from 0.9 to 1.3V. Of course, other voltage ranges are possible. The Vctrl code is a digital 6-bit code having a particular linear range of interest (e.g., 20-50) for controlling the VCO.

Figure 10:
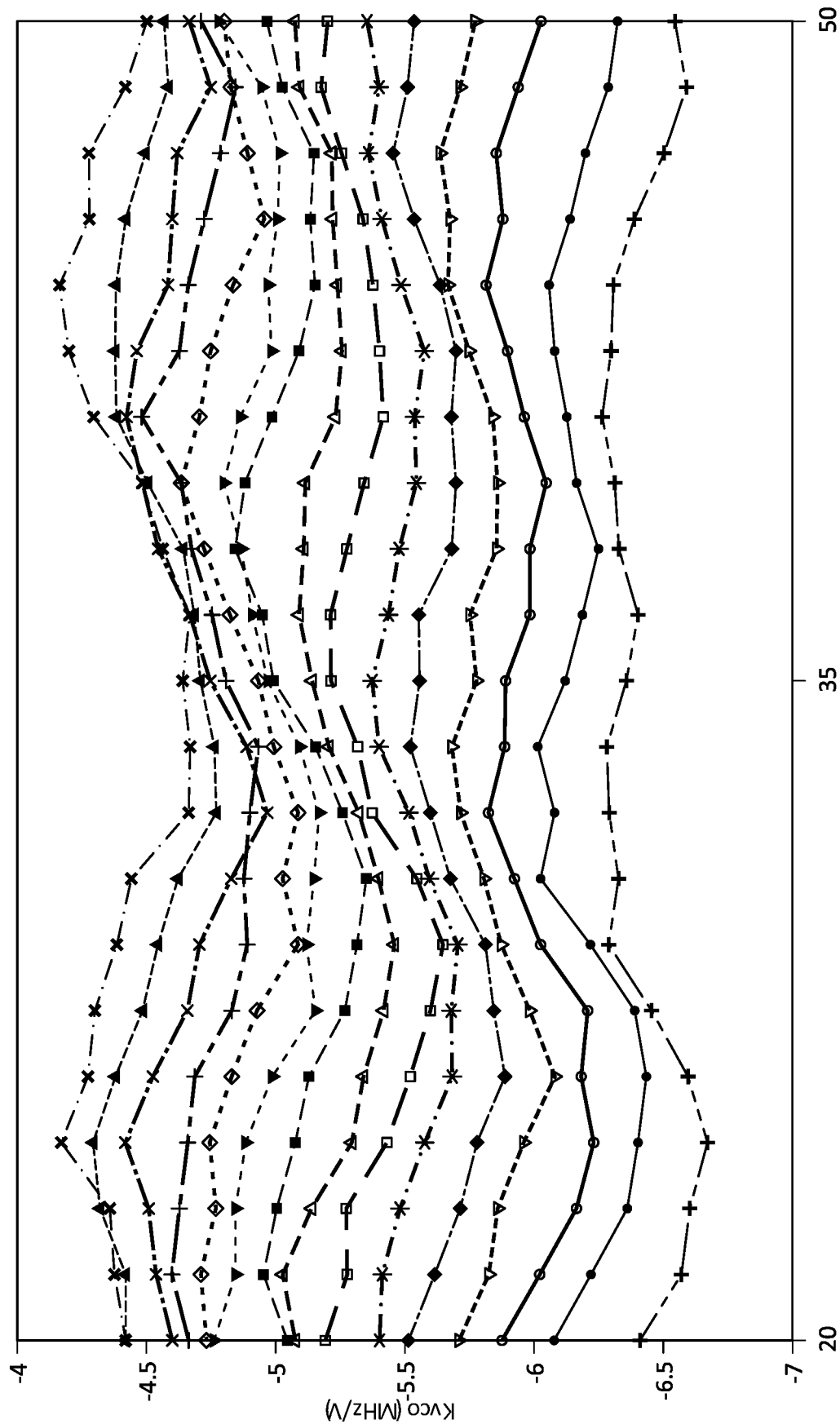
FIG. 10 illustrates the Kvco performance of a "good" part for a varactor slice.
Figure 11:
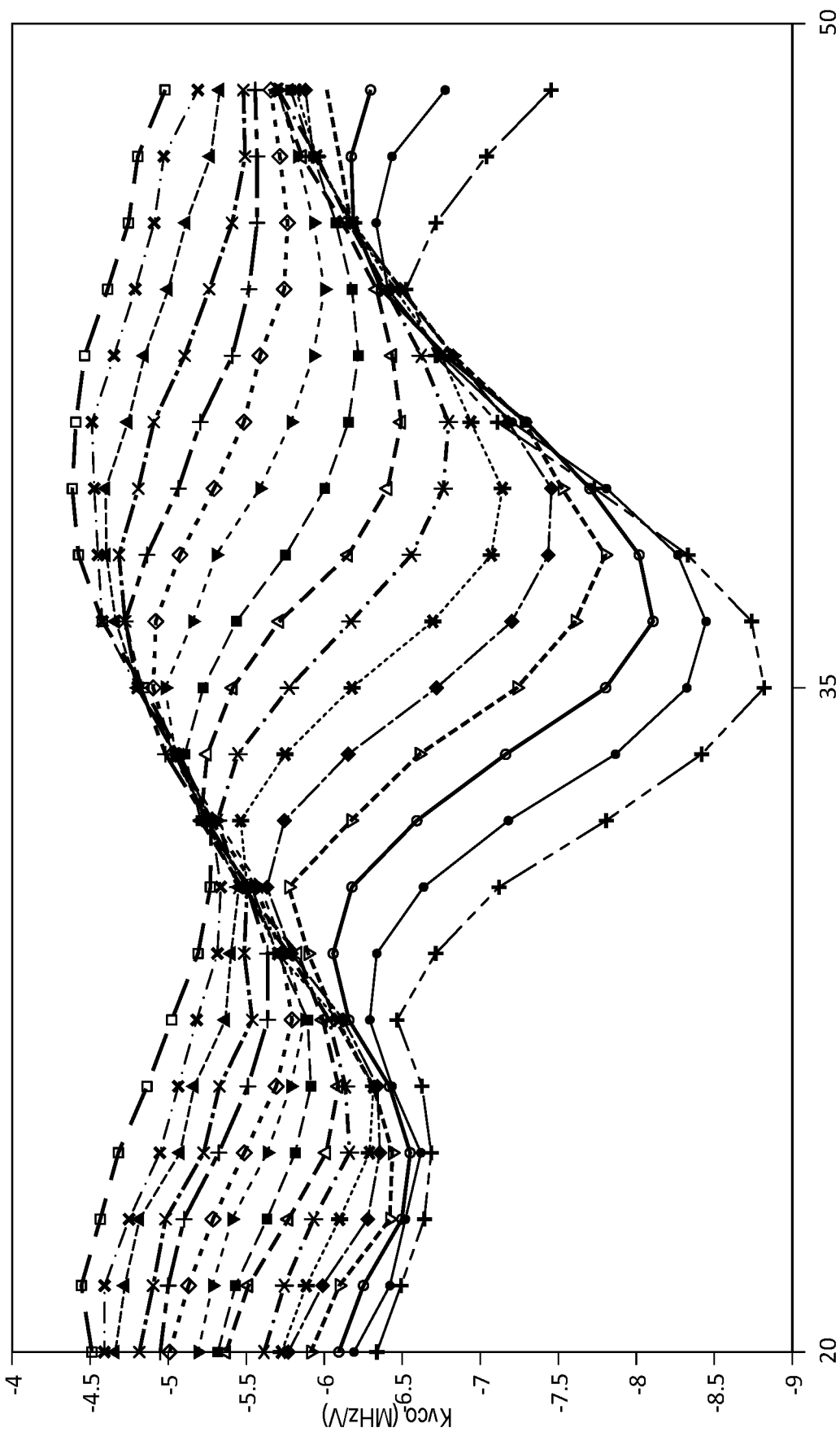
FIG. 11 illustrates the Kvco performance of a "bad" part for the same slice.

FIG. 10 illustrates the Kvco performance of a "good" part for varactor slice 1×. FIG. 11 illustrates the Kvco performance of a "bad" part on the same slice. Each curve shown in FIGS. 10 and 11 corresponds to a fine calibration setting (one of the 16 Vref settings) and Vctrl is swept for each fine calibration setting and Kvco is calculated between adjacent Vctrl codes. Note, that some fine calibration values have more deviation than others in FIG. 10. Note that even in the failing Kvco curves shown in FIG. 11, if only a few points are evaluated in the bottom curves, the evaluation may miss the larger deviations in the curve.

An improved test approach isolates Kvco defects in the VCO by mapping system level performance of the PLL in a transceiver environment to the PLL loop parameters, namely Vctrl, coarse calibration (kv_coarse<3:0>), and fine calibration (16 Vref settings). As noted above, the VCO gain ($K_{VCO}$) controls the closed loop bandwidth (BW) of the PLL. A gain error in $K_{VCO}$ leads to a reduction in PLL bandwidth, resulting in a BLE transmit modulation failure. By isolating Kvco defects in the VCO, the test approach described herein provides a robust indicator for BLE transmit modulation and is able to detect BLE transmit modulation failures due to unforeseen defects in the manufacturing process.

As discussed above, modulation failures show up as non-linearity in the VCO. However, instead of looking at the linearity of the VCO as a whole, the test approach described herein looks at the individual circuit blocks in the VCO, i.e., the individual analog varactor slices and the associated DACs that are responsible for generating the desired linear relationship. That approach prevents non-linearities in one circuit block from being masked by the other circuit blocks. The test approach views the individual circuit blocks as a DAC that generates a frequency in response to a digital code. Then, the test approach applies the linearity tests associated with DACs—namely differential non-linearity (DNL) and integral non-linearity (INL)—to those blocks. Instead of looking at a few points on each DAC, the test approach described herein measures each input code for each DAC. Embodiments use firmware operating on a microcontroller unit (MCU) or other processor in the integrated circuit to speed up the tests. The test quickly and accurately detects BLE transmit modulation failures, which traditionally would require a full system level test to detect.

The test approach described herein treats each analog varactor slice as a DAC. With the PLL configured to be open loop, for each fine code (Vref) for each slice, the test sweeps Vctrl, and measures the frequency. Based on the measured frequency for each Vctrl setting, the gain Kvco is determined, and linearity is measured. In embodiments the linearity measurement includes at least INL. The INL gives the deviation of the slope of the gain (i.e., Kvco) from the nominal, and is a measurement indicative of the gain error in Kvco. Other embodiments determine both INL and DNL.

In some cases, the test may also compute a maximum INL for each analog varactor slice and compare that maximum to a threshold INL to determine if the slice passes the modulation testing.

Figure 12:
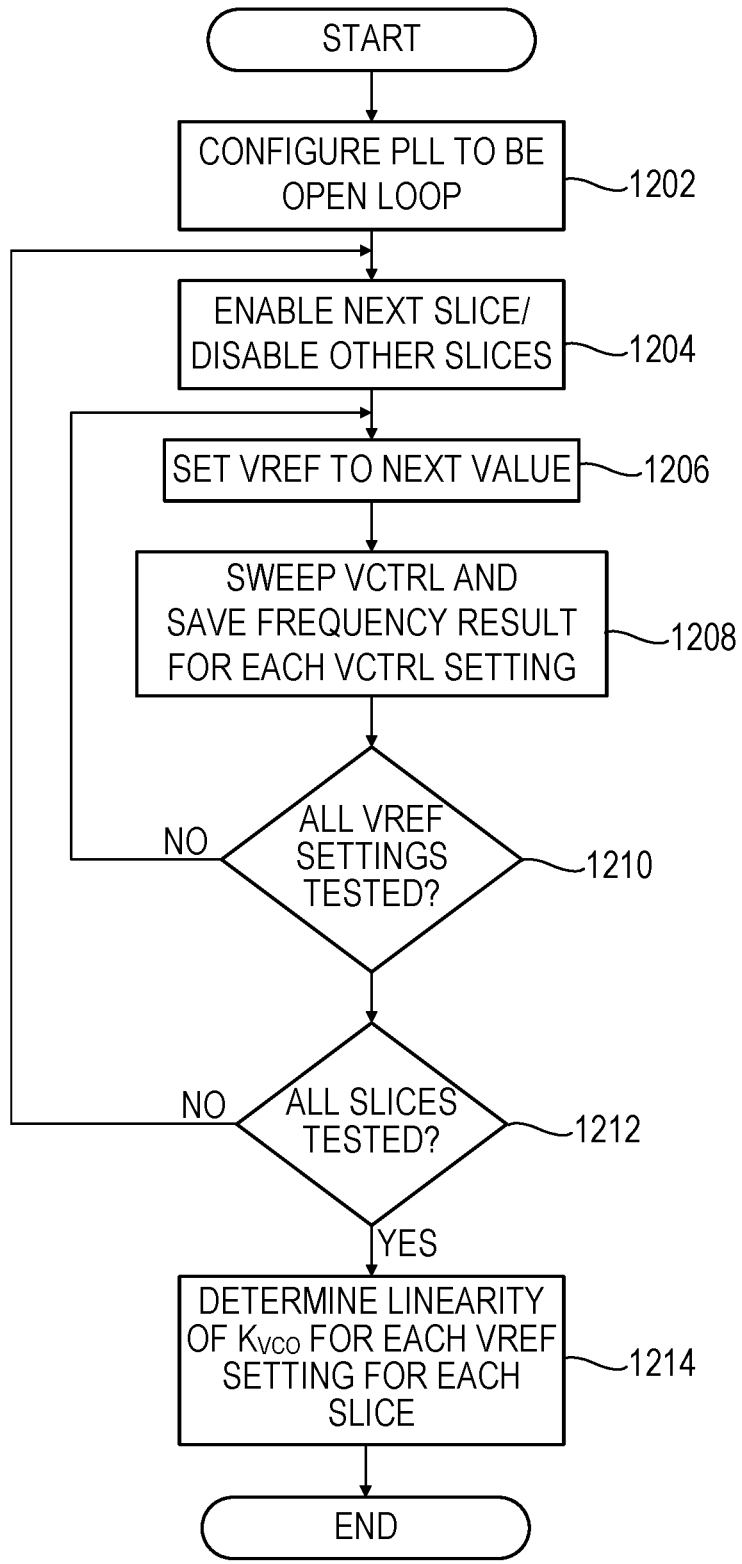
FIG. 12 illustrates a flow diagram of an embodiment of the test approach described herein.

FIG. 12 illustrates a flow chart of an embodiment of the test approach. In 1202 the PLL 110 (see FIG. 1) is configured to be open loop. In 1204, the MCU 422 (see FIG. 4) configures kv_coarse to select a next one of the slices. If it's the first time through the loop, the MCU selects a first slice. In 1206 Vref is set to a next voltage or a first voltage at the beginning of the loop. In an embodiment, there are sixteen voltage settings for Vref. Other embodiments can have more or fewer settings for Vref. In 1208, the test sweeps Vctrl through its voltage settings (or at least across the linear range) by adjusting Vctrl setting of the DAC 611 (see FIG. 6) and measures the resulting frequency for each Vctrl setting. In an embodiment, test control logic controls Vctrl instead of the loop filter 119 (see FIG. 1), e.g., through the DAC 611, to sweep through the Vctrl settings. In embodiments, the PLL loop filter 119 (see FIG. 1) provides an analog Vctrl signal directly to the VCO and during testing an analog selector circuit (not shown) selects between the output of DAC 611 and the loop filter 119. The measured frequency and associated Vctrl setting for each Vctrl setting is stored and saved for linearity analysis. Referring again to FIG. 4, the LO counter 420 counts the number of clock cycles that occur during one or more periods of a time base. The frequency can be determined by MCU 422 or other digital logic from the number of clock cycles counted and the frequency of the time base. The modulation test checks in 1210 if all the Vref settings have been tested and if not returns to 1206. If all the Vref settings have been tested for a particular slice, the test checks in 1212 if all slices have been tested and if not returns to 1204. If all slices have been checked, the test proceeds to perform the INL and DNL analysis in 1214 to determine the linearity of Kvco for each Vref setting for each slice. Note that INL and DNL analysis is well known in the art and will not be described further herein.

Figure 13:
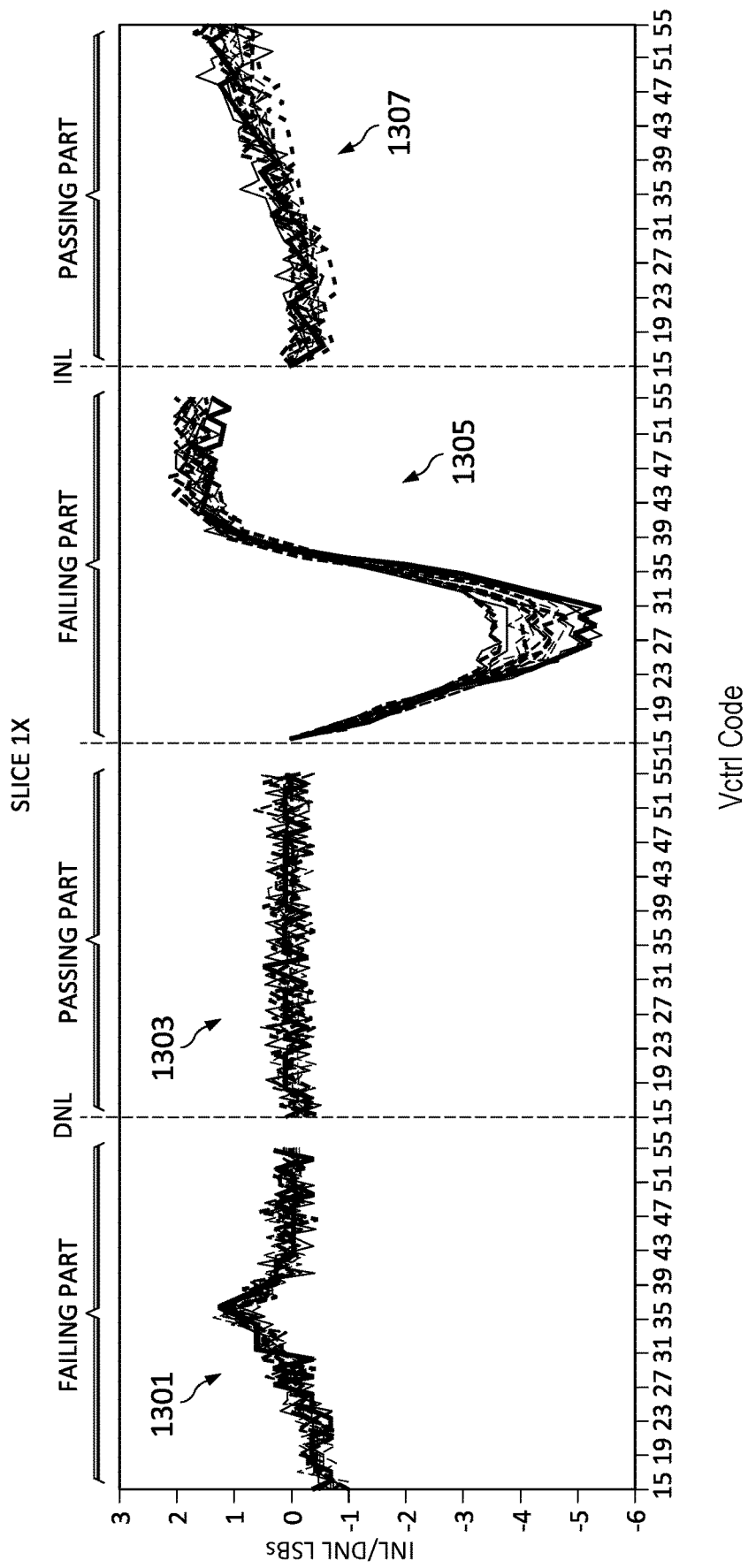
FIG. 13 illustrates example results obtained for a "bad" part and a "good" part by the test approach described herein on a first analog varactor slice included within an analog varactor capacitor array.

FIGS. 13, 14, 15, and 16 illustrate example results obtained on each analog varactor slice when using the test approach described herein. In the figures, the X-axis represents Vctrl (codes associated therewith) and the Y-axis represents least significant bits of INL or DNL values. In particular, FIG. 13 illustrates example test results obtained for a first varactor slice (1× slice). FIG. 13 shows DNL results for a failing part at 1301 and for a passing part at 1303. FIG. 13 also shows INL results for the failing part at 1305 and for the passing part at 1307. Each curve represents DNL (or INL) results for a particular one of the sixteen Vref setting as Vctrl is swept. FIG. 13 shows that the 1× varactor slice exhibits slight DNL issues in 1301 but presents a large INL variation in 1305. Those test results indicate a "bad" or failing slice. In contrast, the DNL and INL results in 1303 and 1307 are for a "passing" part.

Figure 14:
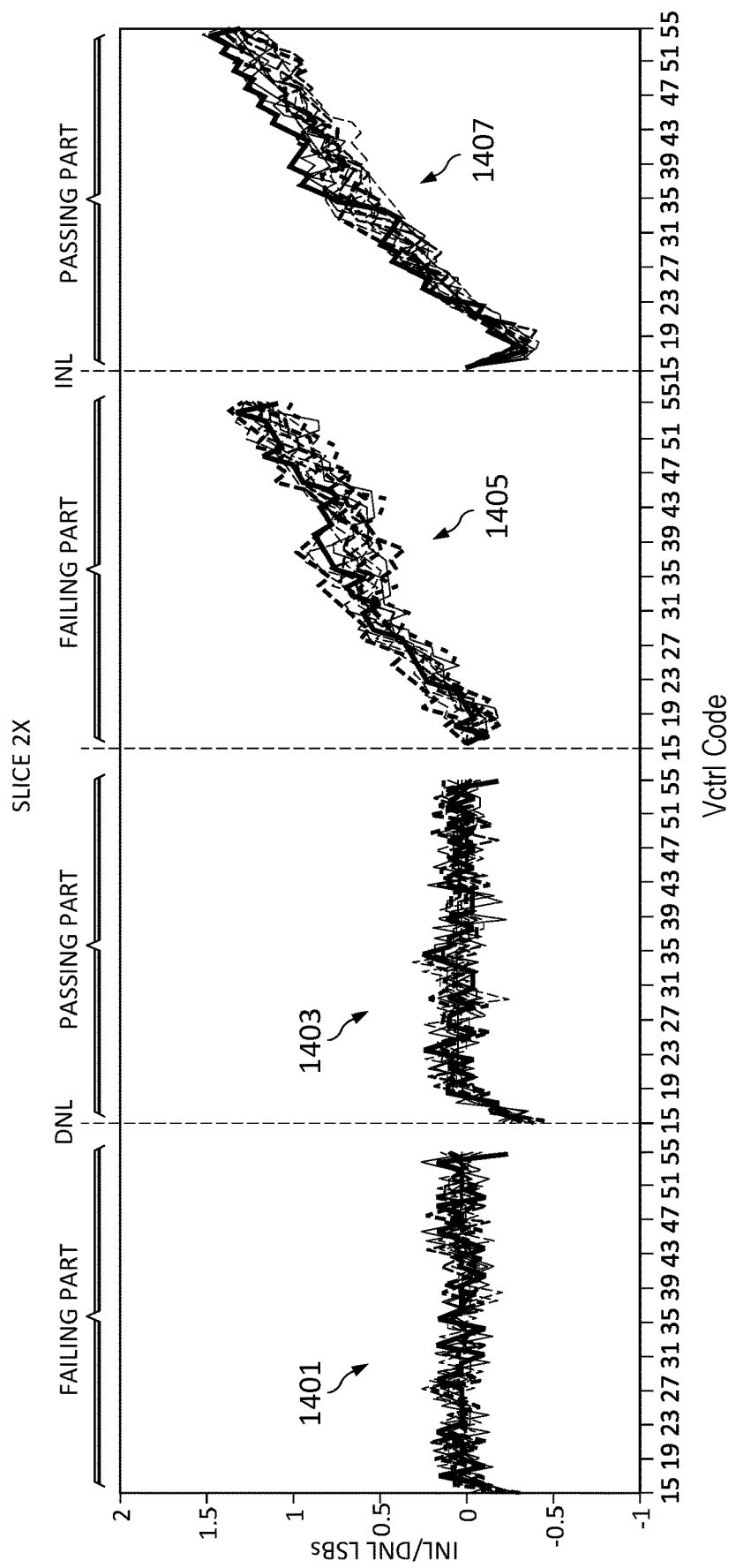
FIG. 14 illustrates example results obtained for a "bad" part and a "good" part by the test approach described herein on a second analog varactor slice included within an analog varactor capacitor array.

FIG. 14 illustrates example test results obtained for a second varactor slice (2× slice). FIG. 14 shows DNL results for a failing part at 1401 and for a passing part at 1403. FIG. 14 also shows INL results for the failing part at 1405 and for the passing part at 1407. Each curve in FIG. 14 represents DNL or INL results for a particular one of the sixteen Vref setting as Vctrl is swept. FIG. 14 shows that test results for both the failing part and the good part are similar. In other words, slice 2× does not contribute to the modulation failure of the failing part.

Figure 15:
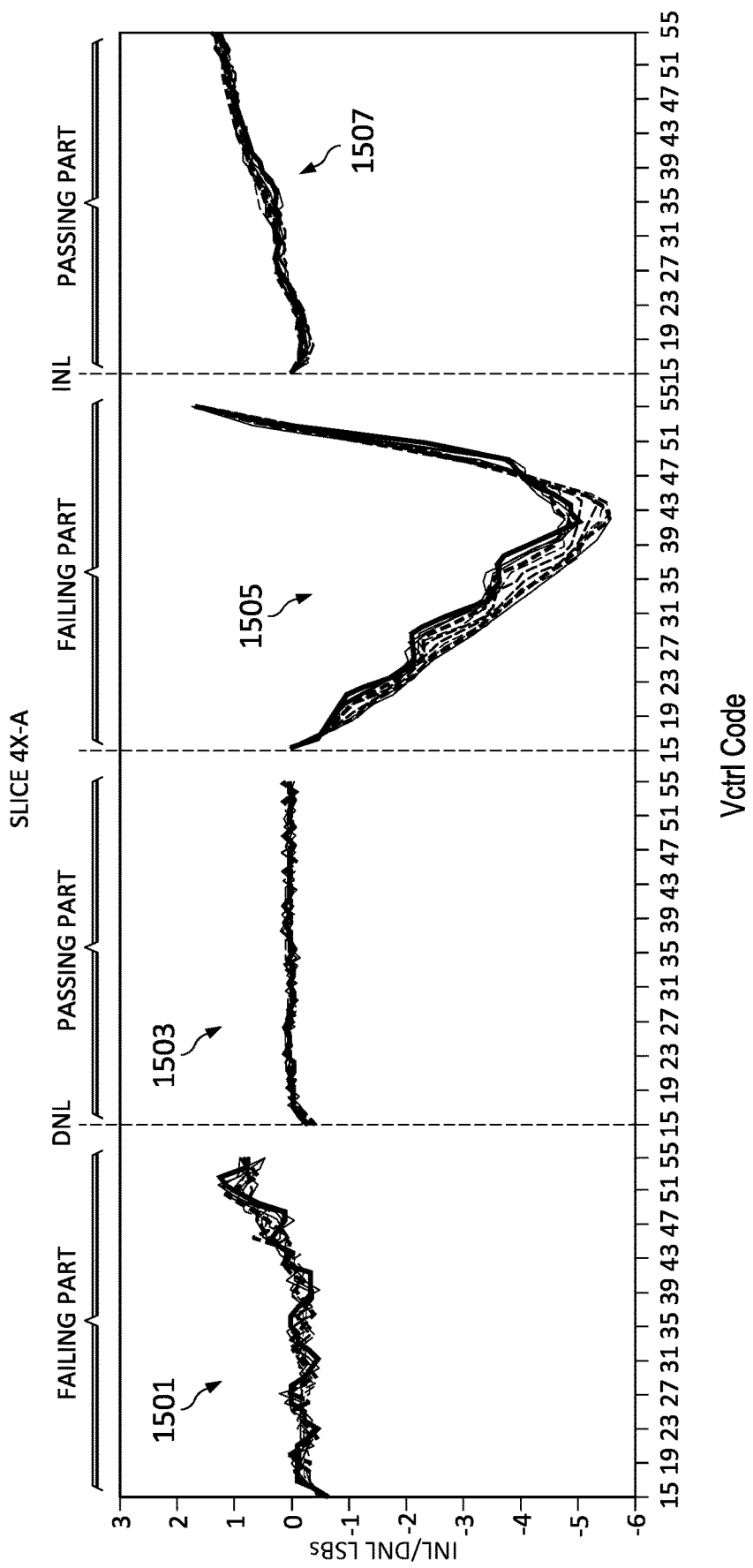
FIG. 15 illustrates example results obtained for a "bad" part and a "good" part by the test approach described herein on a third analog varactor slice included within an analog varactor capacitor array.

FIG. 15 illustrates example test results obtained for a third varactor slice (4×-A). FIG. 15 shows DNL results for the failing part at 1501 and for the passing part at 1503. FIG. 15 also shows INL results for the failing part at 1505 and for the passing part at 1507. Each curve in FIG. 15 represents DNL or INL results for a particular one of the sixteen Vref setting as Vctrl is swept. FIG. 15 shows that the 4×-A varactor slice exhibits slight DNL issues in 1501 but presents a large INL variation in 1505. Those DNL and INL test results at 1501 and 1503 indicate a "bad" or failing slice. In contrast, the curves shown in 1503 and 1507 show DNL and INL results for a "passing" part.

Figure 16:
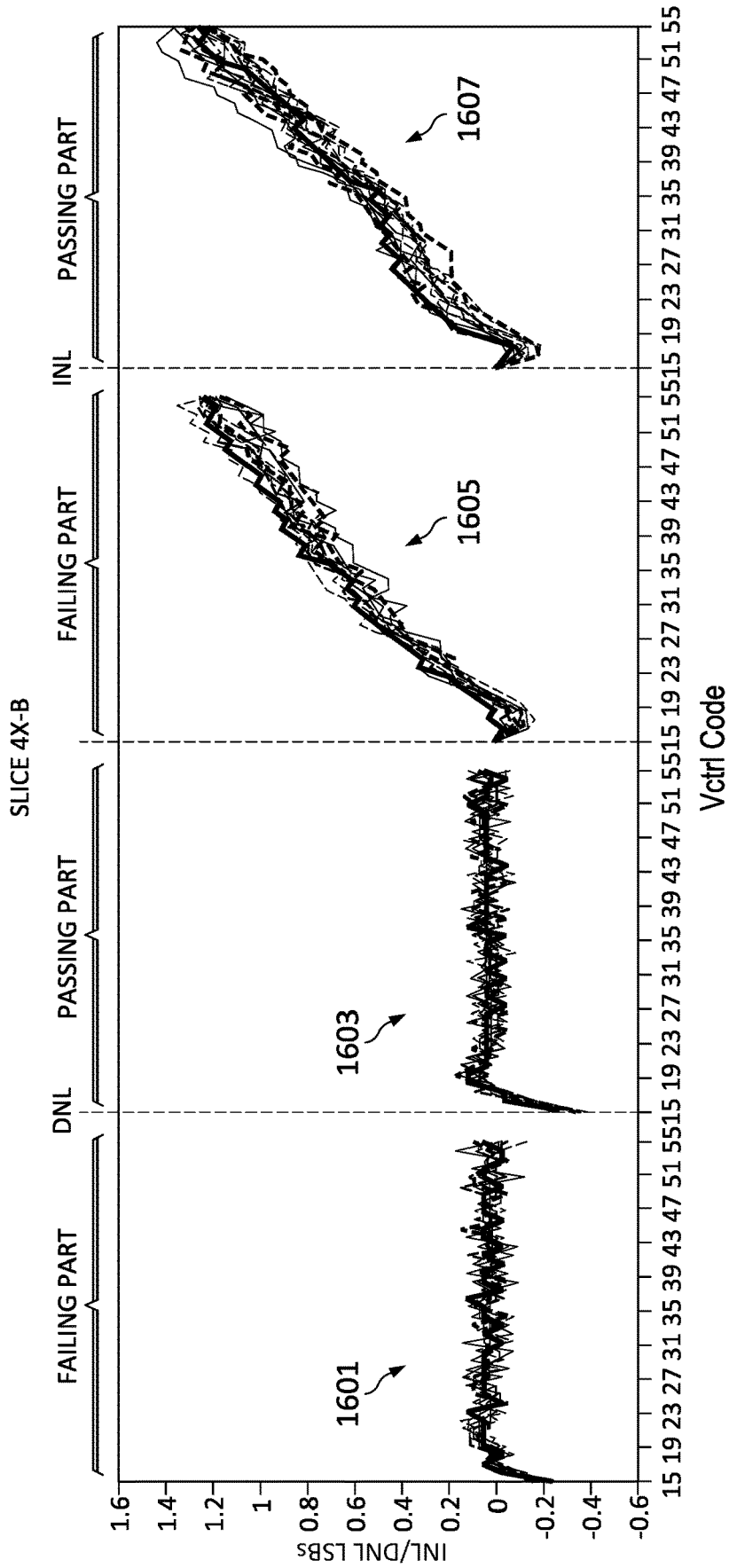
FIG. 16 illustrates example results obtained for a "bad" part and a "good" part by the test approach described herein on a fourth analog varactor slice included within an analog varactor capacitor array.

FIG. 16 illustrates example test results obtained for a fourth varactor slice (4×-B slice). FIG. 16 shows DNL results for a failing part at 1601 and for a passing part at 1603. FIG. 16 also shows INL results for the failing part at 1605 and for the passing part at 1607. Each curve in FIG. 16 represents DNL or INL results for a particular one of the sixteen Vref setting as Vctrl is swept. FIG. 16 shows that the test results for both the failing part and the good part are similar. In other words, slice 4×-B slice does not contribute to the modulation failure of the failing part.

Modulation testing as described in FIG. 12 can be performed quickly and at room temperature. The test approach described herein can successfully detect a BLE transmission modulation failure equivalent to any slice within the analog varactor array failing to meet BLE modulation specification requirements ($0.9<df1<1.1$; $df2>0.74$; $df2/df1>0.8$). By testing each varactor slice individually and for each fine setting, instead of looking at the linearity of the VCO as a whole, the test approach described herein provides an accurate test approach for detecting Bluetooth transmit modulation failures, which avoids the need to perform BLE transmission modulation tests using conventional production test equipment. That reduces both cost and test time.

The modulation testing approach described herein indicates failures in 4×-A and 1× varactor slices in the "failing" part. The more expensive and actual modulation test results from FIG. 8 indicates failure of 4×-A, as can be ascertained from the data. The requirements for successful BLE modulation are met when 4×-B is employed, i.e., KV COARSE of 1011, while modulation testing approach described herein indicates failure when 4×-A is employed, i.e., KV COARSE of 0111. In both cases, the effective Kvco and bandwidth of the PLL is the same.

As noted above, conventional testing uses expensive production test equipment to test BLE transmission modulation. Unlike conventional testing, the test approach described herein may be implemented in firmware operating on an MCU on the integrated circuit, e.g., MCU 422 shown in FIG. 4, on digital test logic, or a combination of a programmed microcontroller and digital test logic.

In addition to reducing cost, the test approach described can significantly reduce test time if the testing is run on-chip. For example, when BLE transmission modulation testing described herein uses conventional production test equipment, test measurements may take approximately 109 ms on a single DAC. With 16 Vref settings and 4 slices there are 64 DACs to be tested in an embodiment. Thus, testing the multiple DACs can take approximately 7 seconds (109 ms×64) to obtain all test data using conventional production test equipment. In contrast to use of conventional test equipment, the modulation testing described herein when run on-chip (e.g., controlled in firmware running on an MCU) can obtain test data from all DACs in approximately 0.5 seconds. In some embodiments, the test approach described herein reduces test time by writing the test in firmware, avoiding floating point math to speed up execution and keeping track of the worst case DNL and INL across all fine codes for a given slice. Since the test is implemented in firmware, it can also be implemented at probe.

Figure 17:
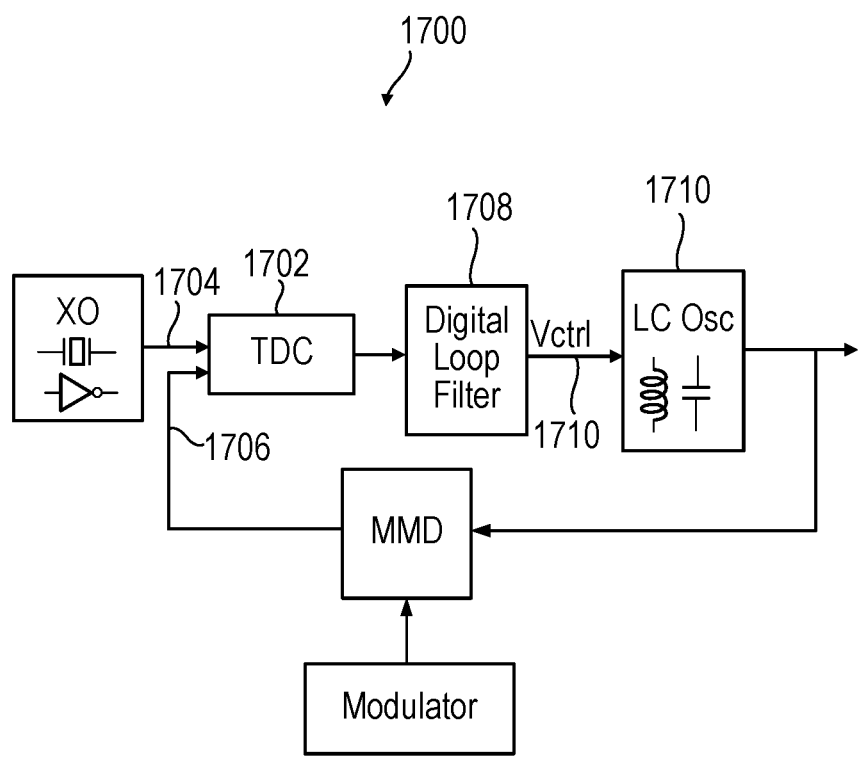
FIG. 17 illustrates a digital PLL used in one or more embodiments.

The test approach described herein works with both VCOs and digitally controlled oscillators (DCOs). The approach works with digital PLLs as well as analog PLLs. Referring to FIG. 17 an embodiment of a digital PLL 1700 includes a time-to-digital converter (TDC) 1702 that provides the phase difference between the reference clock signal 1704 and the feedback signal 1706 to the digital loop filter 1708. The digital loop filter 1708 supplies the DCO 1710 implemented as an LC oscillator with a digital control signal Vctrl 1712. In such an embodiment, the digital Vctrl signal controls the capacitance and thus the frequency of an LC oscillator by, e.g., turning on and off switches (transistors) coupled between capacitors and a power supply node such as ground. Alternatively, one or more embodiments uses a digital to analog converter such as DAC 611 (see FIG. 6) coupled to the digital loop filter output to control the VCO shown in FIG. 4. In such embodiments, a multiplexer circuit (not shown) selects either the digital loop filter output or a test setting as the input (Vctrl setting) to DAC 611. Note that the MHz/control parameter is independent of oscillator realization. Thus, the modulation testing described herein can be extended to ring oscillators as well, which tend to have much higher gain (MHz/control parameter), where the parameter being tuned is the delay of the ring oscillator stages using, e.g., current to control the delay with the output still being frequency.

Thus, the techniques described herein provide a low-cost, fast and accurate test approach for detecting Bluetooth transmit modulation failures. The test approach described herein is also robust. By sweeping over all fine codes, the test approach described herein helps to catch manufacturing defects at room temperature, which could show up at other temperatures. Using a single temperature for testing further simplifies and speeds up the modulation testing.

In addition to modulation testing prior to shipping product to customers, the modulation testing can also be done in the field. For example, a part can run a self test to determine which, if any of the slices have failed since being placed in the field. If a particular slice has failed, in some cases the ACAP can be reconfigured, e.g., by discontinuing the use of slice 4×-A and only using the other three slices to generate frequencies, thereby allowing the useful life of the part to be extended.

It is noted that the functional blocks, devices, and/or circuitry described herein can be implemented using various combinations of analog circuits, digital circuits, and programmable circuits such as software programmed on an MCU or other processor to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable circuits can be programmed with software or other programming instructions to implement some of the functionality of the modulation testing including the INL and DNL analysis. It is further noted that the software or other programming instructions can be stored in one or more non-transitory computer-readable mediums (e.g., SRAM, DRAM, non-volatile memory, etc.), and the software or other programming instructions when executed by the programmable integrated circuits cause the programmable integrated circuits to perform at least some of the processes, functions, and/or capabilities described herein.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. An apparatus comprising:
an LC oscillator having a varactor array with a plurality of slices;
an oscillator signal coupled to an output of the LC oscillator;
a resistor ladder providing a plurality of resistor ladder voltages that are selectively coupled to the plurality of slices according to coarse control signals;
a reference voltage coupled to the resistor ladder, the resistor ladder voltages being determined in part based on the reference voltage;
a control voltage coupled to each of the plurality of slices;
control logic to set the reference voltage to a plurality of reference voltage values for each slice of the plurality of slices while other ones of the slices are disabled and to set the control voltage to a plurality of control voltage values for each of the reference voltage values;
a frequency measuring circuit coupled to the output of the LC oscillator and configured to measure a frequency of the oscillator signal for each combination of reference voltage and control voltage for each slice and to supply measured frequency values; and
a storage circuit coupled to the frequency measuring circuit to store the measured frequency values.

2. The apparatus as recited in claim 1 wherein the frequency measuring circuit comprises a counter coupled to the output of the LC oscillator and configured to count a number of cycles of the oscillator signal that occur during a predetermined period of time.

3. The apparatus as recited in claim 1 further comprising a programmed processor coupled to the storage circuit to analyze linearity of oscillator gain (frequency/voltage) based on the measured frequency values for each combination of the reference voltage values and the control voltage values for each slice.

4. The apparatus as recited in claim 3 wherein a modulation failure associated with the LC oscillator is based, at least in part, on the linearity of the oscillator gain.

5. The apparatus as recited in claim 3 wherein integral non-linearity (INL) is used to analyze the linearity.

6. The apparatus as recited in claim 3 further comprising a phase-locked loop (PLL) that includes the LC oscillator and the PLL is configured to be open loop while the reference voltage values and the control voltage values are being applied.

7. The apparatus as recited in claim 1 wherein the slices comprise a first slice having a first maximum capacitance value, a second slice having a second maximum capacitance value that is twice the first maximum capacitance value, a third slice having a third maximum capacitance value that is four times the first maximum capacitance value and a fourth slice having a fourth maximum capacitive value equal to the third maximum capacitive value.

8. The apparatus as recited in claim 1 wherein each of the slices comprises a plurality of capacitors, each of the capacitors being coupled to the control voltage and selectively to one of the resistor ladder voltages or a voltage that disables a particular one of the slices.

9. The apparatus as recited in claim 4 wherein responsive to a failure of one of the slices based on analysis of the linearity of the oscillator gain, the LC oscillator is reconfigured to omit use of the one of the slices that failed the analysis of the linearity of oscillator gain.

10. The apparatus as recited in claim 2 further comprising a microcontroller unit coupled to the counter and configured to determine a frequency of the oscillator signal based in part on the number of cycles counted.

11. An apparatus comprising:
an LC oscillator having a varactor array with a plurality of slices;
an oscillator signal coupled to an output of the LC oscillator;
a plurality of voltages respectively coupled to capacitors of one of slices when the one of the slices is enabled;
a control voltage coupled to the capacitors of the one of the slices;
control logic to vary voltage values of the plurality of voltages respectively coupled to the capacitors of the one of the slices that is enabled while other ones of the slices are disabled and the control logic is further configured to set the control voltage to a plurality of control voltage values;
a frequency measuring circuit coupled to the output of the LC oscillator and configured to measure a frequency of the oscillator signal for each combination of control voltage values and variation in the voltage values of the plurality of voltages supplied to each slice and to supply measured frequency values; and
wherein the apparatus is configured to analyze linearity of oscillator gain (frequency/voltage) based on the measured frequency values for each combination of the voltage values of the plurality of voltages and the control voltage values for each slice.

12. The apparatus as recited in claim 11 further comprising a resistor ladder coupled to a reference voltage and coupled to the slices to supply the plurality of voltages.

13. The apparatus as recited in claim 12 further wherein the reference voltage is varied by the control logic to generate the variation in the voltage values of the plurality of voltages.

14. The apparatus as recited in claim 11 further comprising a programmed processor to analyze the linearity of the oscillator gain.

15. The apparatus as recited in claim 11 wherein integral non-linearity (INL) is used to analyze the linearity.

16. The apparatus as recited in claim 11 further comprising a phase-locked loop (PLL) that includes the LC oscillator and the PLL is configured to be open loop while the voltage values of the plurality of voltages and the control voltage values are being applied.

17. The apparatus as recited in claim 11 wherein responsive to a failure of one of the slices based on analysis of the linearity of the oscillator gain, the LC oscillator is reconfigured to omit use of the one of the slices that failed the analysis of the linearity of oscillator gain.

* * * * *

UNITED STATES PATENT AND TRADEMARK OFFICE
CERTIFICATE OF CORRECTION

| | | |
|---|---|---|
| PATENT NO. | : 12,372,572 B2 | Page 1 of 1 |
| APPLICATION NO. | : 18/174003 | |
| DATED | : July 29, 2025 | |
| INVENTOR(S) | : Anant Verma et al. | |

It is certified that error appears in the above-identified patent and that said Letters Patent is hereby corrected as shown below:

In the Claims

In Column 12, Line 24, Claim 11 replace "of one of slices" with --of one of the slices--.

Signed and Sealed this
Eighteenth Day of November, 2025

John A. Squires
*Director of the United States Patent and Trademark Office*